United States Patent
Lee et al.

(10) Patent No.: US 10,516,382 B2
(45) Date of Patent: Dec. 24, 2019

(54) PIEZOELECTRIC VIBRATION MEMBER, METHOD OF MANUFACTURING THE SAME, AND PIEZOELECTRIC VIBRATOR

(71) Applicant: Samsung Electro-Mechanics Co., Ltd., Suwon-si (KR)

(72) Inventors: Jong Pil Lee, Suwon-si (KR); Seung Mo Lim, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 996 days.

(21) Appl. No.: 14/854,588

(22) Filed: Sep. 15, 2015

(65) Prior Publication Data

US 2016/0079955 A1 Mar. 17, 2016

(30) Foreign Application Priority Data

Sep. 16, 2014 (KR) ........................ 10-2014-0122946

(51) Int. Cl.
*H03H 9/17* (2006.01)
*H03H 3/02* (2006.01)

(52) U.S. Cl.
CPC ............... *H03H 9/17* (2013.01); *H03H 3/02* (2013.01)

(58) Field of Classification Search
CPC .................................. H01L 41/22; H03H 9/17
USPC .................................................. 310/321, 367
See application file for complete search history.

(56) References Cited

U.S. PATENT DOCUMENTS

| 6,191,524 | B1* | 2/2001 | Sasaki ............... H03H 9/02133 |
| | | | 310/367 |
| 6,362,561 | B1 | 3/2002 | Kuroda et al. |
| 2008/0036335 | A1 | 2/2008 | Naito et al. |
| 2013/0043771 | A1 | 2/2013 | Sasaki et al. |
| 2013/0241359 | A1 | 9/2013 | Naito et al. |

FOREIGN PATENT DOCUMENTS

| CN | 1238245 A | 12/1999 |
| CN | 102957395 A | 3/2013 |
| CN | 103326690 A | 9/2013 |
| JP | 2008-67345 A | 3/2008 |
| JP | 2010-109526 A | 5/2010 |
| JP | 2010-109527 A | 5/2010 |

(Continued)

OTHER PUBLICATIONS

Chinese Office Action dated Mar. 28, 2018 in corresponding Chinese Patent Application No. 201510138152.2 (14 pages in English and 8 pages in Chinese).

(Continued)

*Primary Examiner* — Thomas M Dougherty
*Assistant Examiner* — Karen B Addison
(74) *Attorney, Agent, or Firm* — NSIP Law

(57) ABSTRACT

There is provided a piezoelectric vibration member including: a vibration substrate including a vibrating portion and a surrounding portion which is thinner than the vibrating portion; and vibrating electrodes disposed on one surface and the other surface of the vibrating portion in a thickness direction, wherein the vibrating portion includes protrusion portions protruding in relation to one surface and the other surface of the surrounding portion in the thickness direction, and at least one side surface of the protrusion portion has two or more crystal planes.

8 Claims, 18 Drawing Sheets

(56) References Cited

FOREIGN PATENT DOCUMENTS

| | | | |
|---|---|---|---|
| JP | 2010109526 A | * | 5/2010 |
| JP | 2014-027506 A | | 2/2014 |
| JP | 2014-135534 A | | 7/2014 |
| JP | 2014-143588 A | | 8/2014 |
| KR | 10-2000-0006051 A | | 1/2000 |

OTHER PUBLICATIONS

Chinese Office Action dated Mar. 28, 2018 in corresponding Chinese Patent Application No. 201510138361.7 (14 pages in English and 8 pages in Chinese).

Chinese Office Action dated Nov. 2, 2018 in corresponding Chinese Patent No. 201510138152.2 (13 pages in English, 8 pages in Chinese).

Japanese Office Action dated Nov. 6, 2018 in corresponding Japanese Patent Application No. 2015-183209 (5 pages in English, 2 pages in Japanese).

Japanese Office Action dated Jun. 11, 2019 in corresponding Japanese Patent Application No. 2015-183209 (7 pages in English, 3 pages in Japanese).

Korean Office Action dated Feb. 28, 2019 in corresponding Korean Patent Application No. 10-2014-0122946 (7 pages in English, 6 pages in Korean).

* cited by examiner

B-B'

PIEZOELECTRIC VIBRATION MEMBER, METHOD OF MANUFACTURING THE SAME, AND PIEZOELECTRIC VIBRATOR

CROSS-REFERENCE TO RELATED APPLICATION

This application claims the priority and benefit of Korean Patent Application No. 10-2014-0122946 filed on Sep. 16, 2014, with the Korean Intellectual Property Office, the disclosure of which is incorporated herein by reference.

BACKGROUND

The present disclosure relates to a piezoelectric vibration member, a method of manufacturing the same, and a piezoelectric vibrator.

A piezoelectric vibrator is an apparatus generating vibrations having a certain frequency through a piezoelectric vibration member vibrating due to a piezoelectric phenomenon occurring in the piezoelectric vibration member when voltage is applied thereto.

Since the piezoelectric vibrator has a stable vibrational frequency, such a device has been used in several core components providing a reference signal level as well as in an oscillation circuit of a computer or a communications device.

A piezoelectric vibration member formed of crystal includes a vibration substrate using the crystal as a base material and an electrode disposed on the vibration substrate, wherein the vibration substrate may have various shapes depending on required physical properties.

When a piezoelectric vibration member in a thickness shear vibration mode is formed so that a thickness of the vibration substrate is gradually reduced from a central portion thereof toward end portions thereof, a damping amount of vibration displacement in the end portions is increased, whereby an effect in which vibration energy is trapped in the central portion of the piezoelectric vibration member may be improved and frequency characteristics such as a CI value, a Q value, and the like, may be improved. An example of a shape of the piezoelectric vibration member that may accomplish a vibration energy trapping effect may include a convex shape in which a convex curved surface is formed as a main surface, a bevel shape in which a space between a flat and thick central portion and an edge of an end portion is formed as an inclined surface, a mesa shape in which a central portion is flat and a surrounding portion of the central portion is thin, and the like.

In a case in which the thicknesses of the thick, flat central portion and the thin surrounding portion are rapidly changed in the mesh shaped piezoelectric vibration member, an energy trapping effect may be decreased, and electrode connectivity may deteriorate. Therefore, a piezoelectric vibration member capable of solving these problems has been required.

SUMMARY

An aspect of the present disclosure may provide a piezoelectric vibration member, a method of manufacturing the same, and a piezoelectric vibrator.

According to an aspect of the present disclosure, a piezoelectric vibration member includes: a vibration substrate having protrusion portions disposed on one surface and the other surface thereof in a thickness direction of the vibration substrate; and vibrating electrodes, wherein at least one side surface of the protrusion portion has two or more crystal planes, whereby an energy trapping effect is excellent and electrode connectivity is improved.

According to another aspect of the present disclosure, a method of manufacturing a piezoelectric vibration member is provided, in which resist patterns are formed on a crystal wafer, protrusion portions are formed, the crystal wafer from which the resist patterns have been removed is re-etched, and thus at least one side surface of the protrusion portion has two or more crystal planes, whereby an energy trapping effect is excellent and electrode connectivity is improved.

According to another aspect of the present disclosure, a piezoelectric vibrator includes: a piezoelectric vibration member in which at least one side surface of a protrusion portion has two or more crystal planes; upper and lower cases accommodating the piezoelectric vibration member therein; connection electrodes connected to an electrode part of the piezoelectric vibration member; and external electrodes.

BRIEF DESCRIPTION OF DRAWINGS

The above and other aspects, features and advantages of the present disclosure will be more clearly understood from the following detailed description taken in conjunction with the accompanying drawings, in which.

DETAILED DESCRIPTION

Figure 1:
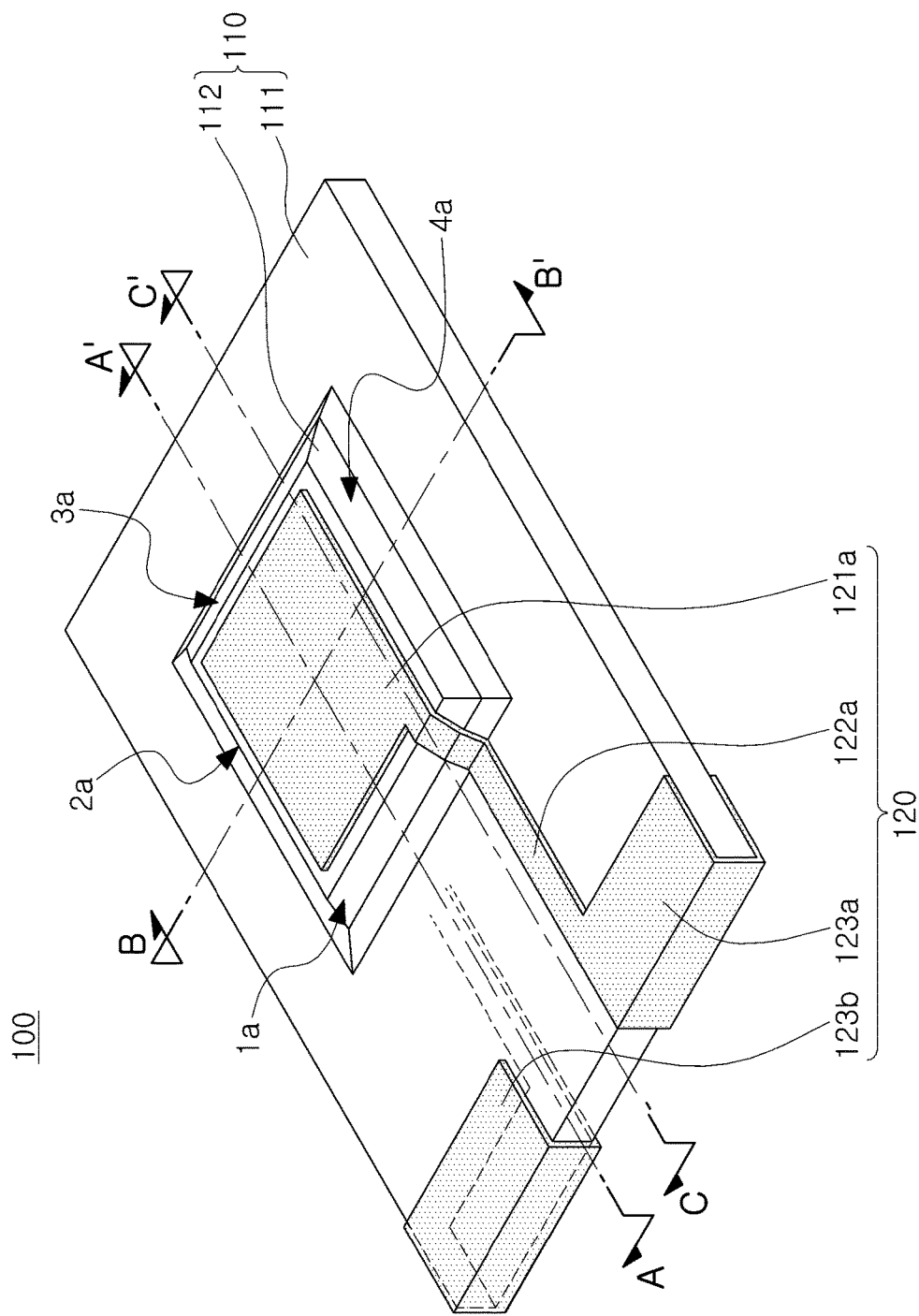
FIG. 1 is a perspective view of a piezoelectric vibration member according to an exemplary embodiment in the present disclosure.

Hereinafter, embodiments of the present disclosure will be described in detail with reference to the accompanying drawings.

The disclosure may, however, be embodied in many different forms and should not be construed as being limited to the embodiments set forth herein. Rather, these embodiments are provided so that this disclosure will be thorough and complete, and will fully convey the scope of the disclosure to those skilled in the art.

In the drawings, the shapes and dimensions of elements maybe be exaggerated for clarity, and the same reference numerals will be used throughout to designate the same or like elements.

Piezoelectric Vibration Member

Hereinafter, a piezoelectric vibration member according to an exemplary embodiment will be described.

FIG. 1 is a perspective view of a piezoelectric vibration member 100 according to an exemplary embodiment.

Figure 2:
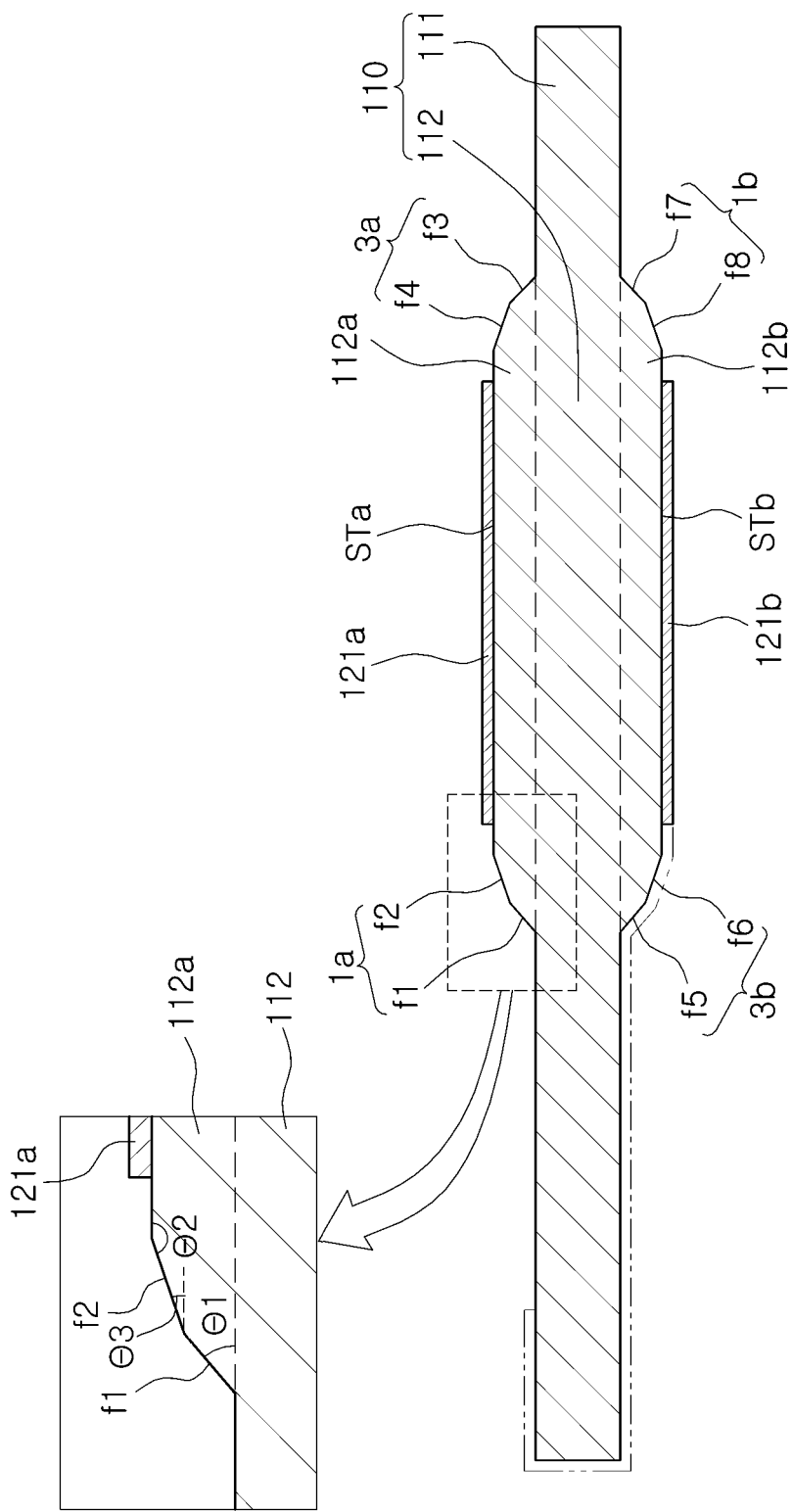
FIG. 2 is a cross-sectional view of the piezoelectric vibration member taken along line A-A' of FIG. 1.
Figure 3:
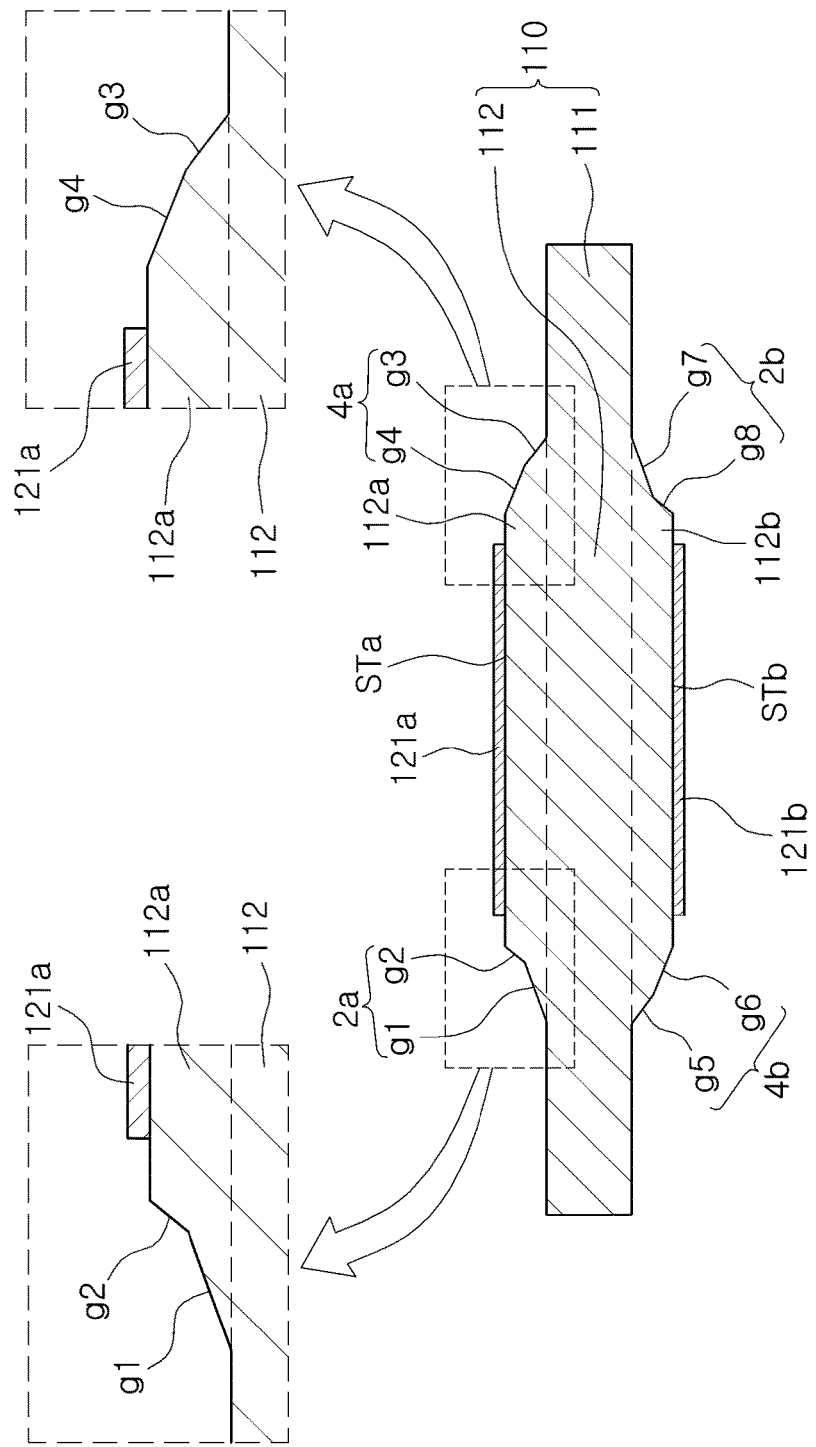
FIG. 3 is a cross-sectional view of the piezoelectric vibration member taken along line B-B' of FIG. 1.

FIG. 2 is a cross-sectional view of the piezoelectric vibration member 100 taken along line A-A' of FIG. 1; and FIG. 3 is a cross-sectional view of the piezoelectric vibration member 100 taken along line B-B' of FIG. 1.

Referring to FIGS. 1 through 3, the piezoelectric vibration member 100 according to an exemplary embodiment may include a vibration substrate 110 and an electrode part 120 disposed on the vibration substrate.

The vibration substrate 110 may include a vibrating portion 112 having a relatively increased thickness and a surrounding portion 111 thinner than the vibrating portion, wherein the vibrating portion 112 may include protrusion portions 112a and 112b which are thicker than one surface and the other surface of the surrounding portion 111 in a thickness direction thereof.

For example, the protrusion portions may include a first protrusion portion 112a protruding in relation to one surface of the surrounding portion 111 in the thickness direction and a second protrusion portion 112b protruding in relation to the other surface of the surrounding portion 111 in the thickness direction.

The vibration substrate 110 included in the piezoelectric vibration member 100 may contain crystal, wherein the crystal serves as a mechanical vibration generator.

According to an exemplary embodiment, the crystal may be quartz.

The electrode part 120 may include vibrating electrodes 121a and 121b disposed on one surface and the other surface of the vibrating portion 112 in the thickness direction, terminal electrodes 123a and 123b disposed on at least one of one surface and the other surface of the surrounding portion 111 in the thickness direction, and connection electrodes 122a and 122b connecting the vibrating electrodes and the terminal electrodes to each other.

A first vibrating electrode 121a may be disposed on one surface of the vibrating portion 112 in the thickness direction and be connected to a first terminal electrode 123a through a first connection electrode 122a, and a second vibrating electrode 121b may be disposed on the other surface of the vibrating portion 112 opposing one surface thereof and be connected to a second terminal electrode 123b through a second connection electrode 122b.

The first terminal electrode 123a may be extended from one surface of the surrounding portion 111 in the thickness direction to one side surface of the surrounding portion and the other surface of the surrounding portion in the thickness direction, and the second terminal electrode 123b may be extended from the other surface of the surrounding portion 111 in the thickness direction to one side surface of the surrounding portion and one surface of the surrounding portion in the thickness direction. However, the present inventive concept is not limited thereto.

According to an exemplary embodiment, one surfaces STa and STb of the protrusion portions 112a and 112b in the thickness direction protruding in relation to one surface and the other surface of the surrounding portion 111 may have a substantially rectangular shape when viewed in plan view, although they do not have a completely rectangular shape due to etching of corner portions thereof, and upper surfaces STa and STb of the protrusion portions described below refer to one surfaces of the protrusion portions in the thickness direction protruding in relation to one surface and the other surface of the surrounding portion 111 in the thickness direction.

In an exemplary embodiment, side surfaces 1a, 1b, 2a, 2b, 3a, 3b, 4a, and 4b of the protrusion portions refer to surfaces connecting each side of the upper surfaces STa and STb of the protrusion portions and one surface and the other surface of the surrounding portion 111 in the thickness direction to each other, and one or more side surfaces of the protrusion portions may include two or more crystal planes.

Each side surface of the protrusion portions 112a and 112b may have an inclined shape, and upper portions of the protrusion portions 112a and 112b may be narrower than lower portions of the protrusion portions 112a and 112b.

According to an exemplary embodiment, the first protrusion portion 112a may include four side surfaces 1a, 2a, 3a, and 4a, the second protrusion portion 112b may include four side surfaces 1b, 2b, 3b, and 4b, and one or more side surfaces of the first and second protrusion portions may have two or more crystal planes.

For example, each side surface of the first and second protrusion portions 112a and 112b may have two or more crystal planes.

The two or more crystal planes included in one or more side surfaces of the protrusion portions 112a and 112b may have different angles of inclination with respect to the surfaces STa and STb of the protrusion portions 112a and 112b in the thickness direction.

For example, as shown in FIG. 2, the cross-sectional view of the piezoelectric vibration member taken along line A-A' of FIG. 1, the first side surface 1a of the first protrusion portion 112a may include two crystal planes f1 and f2, and the third side surface 3a thereof may include two crystal planes f3 and f4.

In addition, as shown in FIG. 2, the first side surface 1b of the second protrusion portion 112b may include two crystal planes f7 and f8, and the third side surface 3b thereof may include two crystal planes f5 and f6.

A first side of the upper surface STa of the first protrusion portion connected to the first side surface 1a of the first protrusion portion 112a may oppose a third side of the upper surface STa of the first protrusion portion connected to the third side surface 3a of the first protrusion portion 112a. In addition, a first side of the upper surface STb of the second protrusion portion connected to the first side surface 1b of the second protrusion portion 112b may oppose a third side of the upper surface STb of the second protrusion portion connected to the third side surface 3b of the second protrusion portion 112b.

For example, as shown in FIG. 3, the cross-sectional view of the piezoelectric vibration member taken along line B-B' of FIG. 1, the second side surface 2a of the first protrusion portion 112a may include two crystal planes g1 and g2, and the fourth side surface 4a thereof may include two crystal planes g3 and g4.

In addition, as shown in FIG. 3, the second side surface 2b of the second protrusion portion 112b may include two crystal planes g7 and g8, and the fourth side surface 4b thereof may include two crystal planes g5 and g6.

A second side of the upper surface STa of the first protrusion portion connected to the second side surface 2a of the first protrusion portion 112a may oppose a fourth side of the upper surface STa of the first protrusion portion connected to the fourth side surface 4a of the first protrusion portion 112a. In addition, a second side of the upper surface STb of the second protrusion portion connected to the second side surface 2b of the second protrusion portion 112b may oppose a fourth side of the upper surface STb of the second protrusion portion connected to the fourth side surface 4b of the second protrusion portion 112b.

According to an exemplary embodiment, as shown in FIG. 2, one or more side surfaces of the protrusion portion 112a may include a crystal plane forming an acute angle (θ1) with respect to an extension plane of one surface of the surrounding portion 111 in the thickness direction and a crystal plane forming an obtuse angle (θ2) with respect to the upper surface STa of the protrusion portion 112a.

Meanwhile, as shown in FIG. 2, in a case in which one side surface of the protrusion portion includes two crystal planes, when an angle formed between a crystal plane of the two crystal planes which is adjacent to the surrounding portion and the extension plane of one surface of the surrounding portion in the thickness direction is θ1, an angle formed between a crystal plane of the two crystal planes which is adjacent to the upper surface of the protrusion portion and the upper surface of the protrusion portion is θ2, and an angle formed between the crystal plane adjacent to the upper surface of the protrusion portion and a plane which is parallel to one surface of the surrounding portion in the thickness direction is θ3, θ1>θ3 may be satisfied.

θ3 may be defined as 180−θ2.

According to an exemplary embodiment, the first side surfaces 1a and 1b, the third side surfaces 3a and 3b, and the fourth side surfaces 4a and 4b of the first and second protrusion portions 112a and 112b may have a convex shape, and the second side surfaces 2a and 2b of the first and second protrusion portions 112a and 112b may have a concave shape.

One or more side surfaces of the first and second protrusion portions 112a and 112b may include a natural crystal plane of a quartz crystal and a crystal plane having an angle of inclination different from that of the natural crystal plane.

For example, the first side surfaces 1a and 1b and the third side surfaces 3a and 3b of the first and second protrusion portions 112a and 112b may include a natural crystal plane of a quartz crystal and a crystal plane having an angle of inclination different from that of the natural crystal plane of the quartz crystal.

For example, as shown in FIGS. 2 and 3, each side surface of the first and second protrusion portions 112a and 112b may have the two or more crystal planes having different angles of inclination to alleviate a step due to a thickness difference between the vibrating portion 112 and the surrounding portion 111, whereby an energy trapping effect for frequency generation through a piezoelectric effect is improved, thereby decreasing energy loss.

Figure 4:
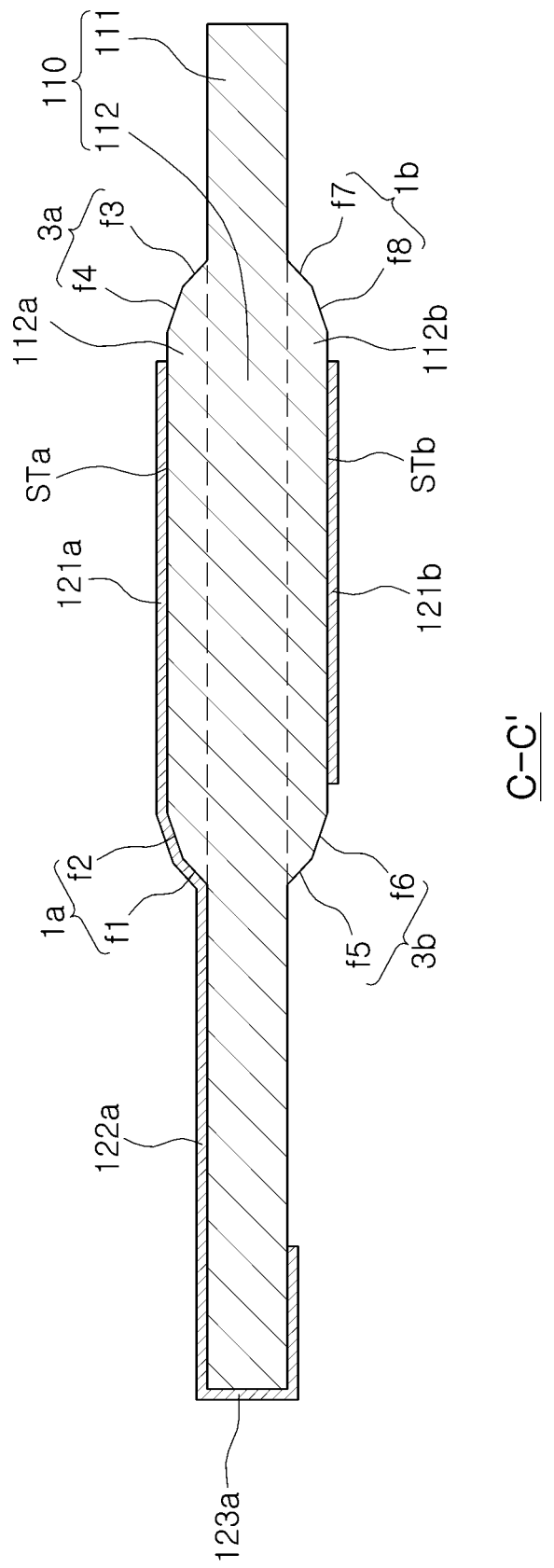
FIG. 4 is a cross-sectional view of a region of the piezoelectric vibration member, in which connection electrodes are disposed, taken along line C-C' of FIG. 1.

FIG. 4 is a cross-sectional view of a region of the piezoelectric vibration member in which connection electrodes are disposed, taken along line C-C' of FIG. 1.

The connection electrodes 122a and 122b connecting the vibrating electrodes 121a and 121b and the terminal electrodes 123a and 123b to each other may be disposed on one or more side surfaces of the protrusion portions 112a and 112b.

For example, the first connection electrode 122a may be disposed on the first side surface 1a of the first protrusion portion 112a, as shown in FIG. 4, and, although not shown, the second connection electrode 122b may be disposed on the third side surface 3a of the second protrusion portion 112b.

According to an exemplary embodiment, since the side surfaces of the protrusion portions 112a and 112b have the two or more crystal planes to alleviate the step between the vibrating portion 112 and the surrounding portion 111, occurrence of an open defect in which the connection electrodes are disconnected due to a rapid change in the angles of inclination of the crystal planes included in the side surfaces of the protrusion portions may be decreased.

Figure 5:
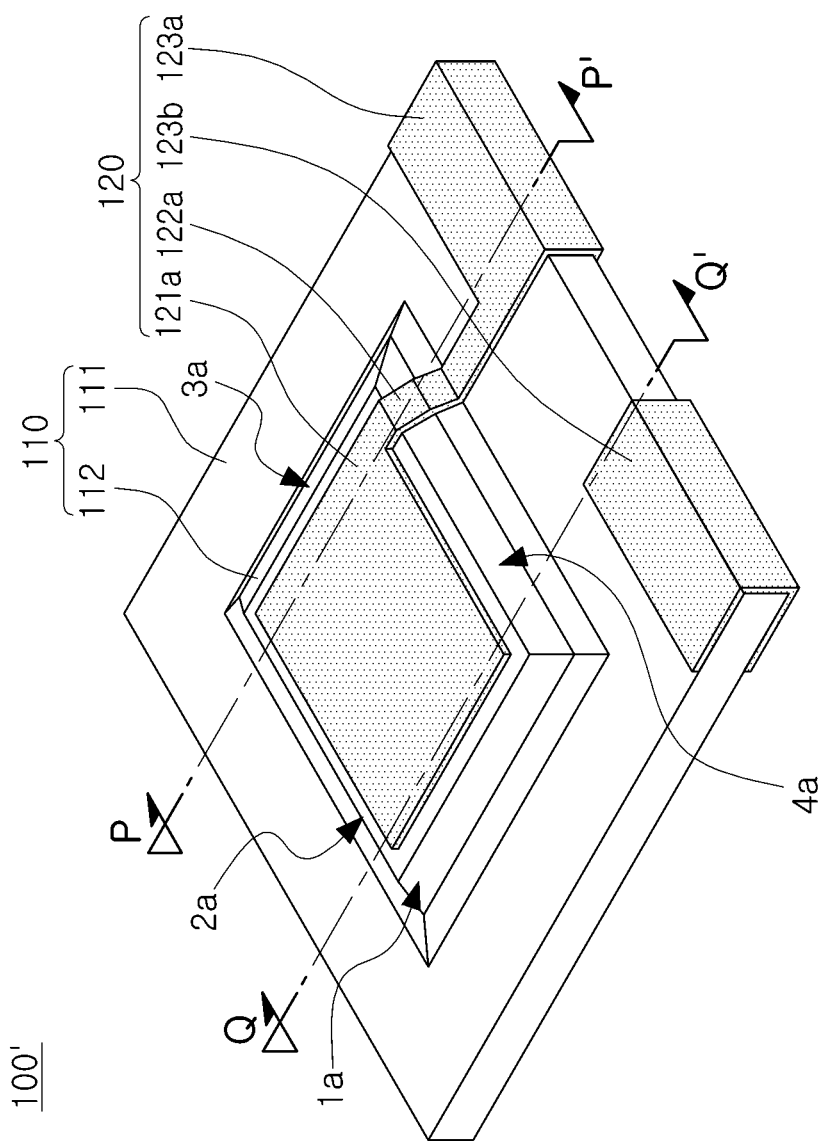
FIG. 5 is a perspective view of a modified example of a piezoelectric vibration member according to an exemplary embodiment in the present disclosure.
Figure 6:
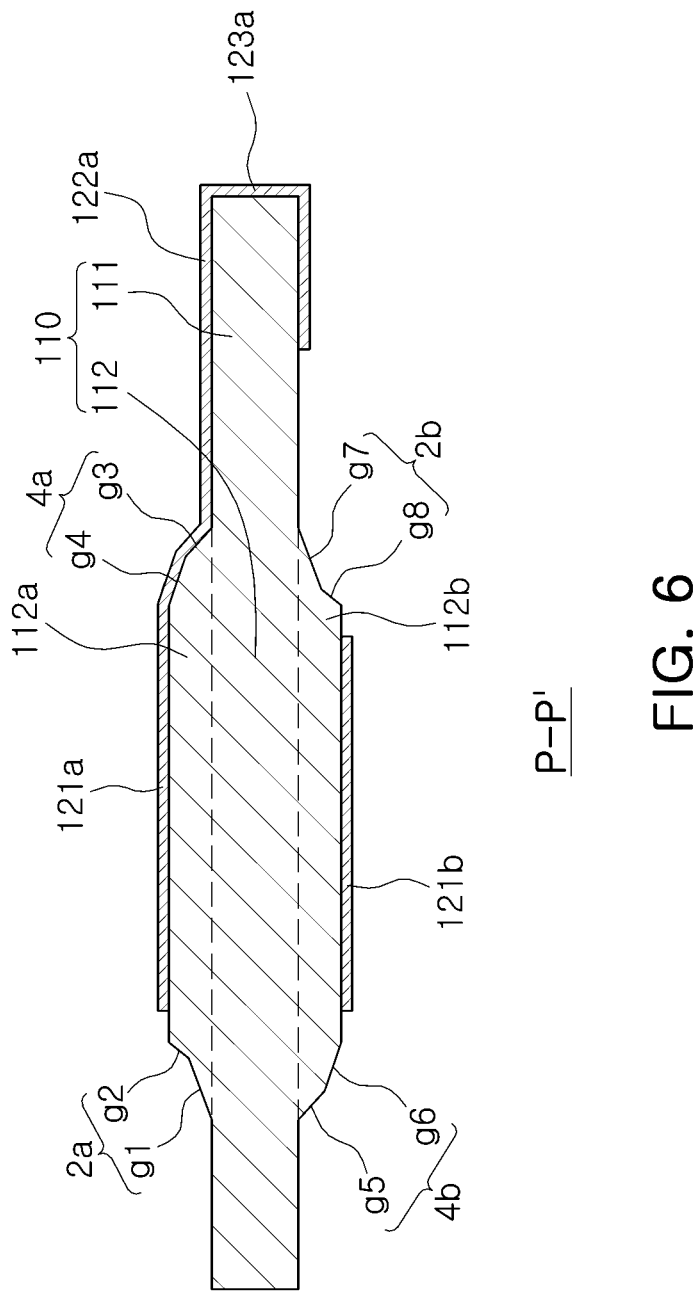
FIG. 6 is a cross-sectional view taken along line P-P' of FIG. 5.

FIG. 5 is a perspective view of a modified example of a piezoelectric vibration member according to an exemplary embodiment; FIG. 6 is a cross-sectional view taken along line P-P' of FIG. 5; and FIG. 7 is a cross-sectional view taken along line Q-Q' of FIG. 5.

As shown in FIG. 5, the modified example of the piezoelectric vibration member 100 according to the present embodiment may be different from the piezoelectric vibration member according to the previous embodiment shown in FIG. 1 in that the connection electrodes are disposed on side surfaces of the protrusion portions having a concave shape.

Figure 7:
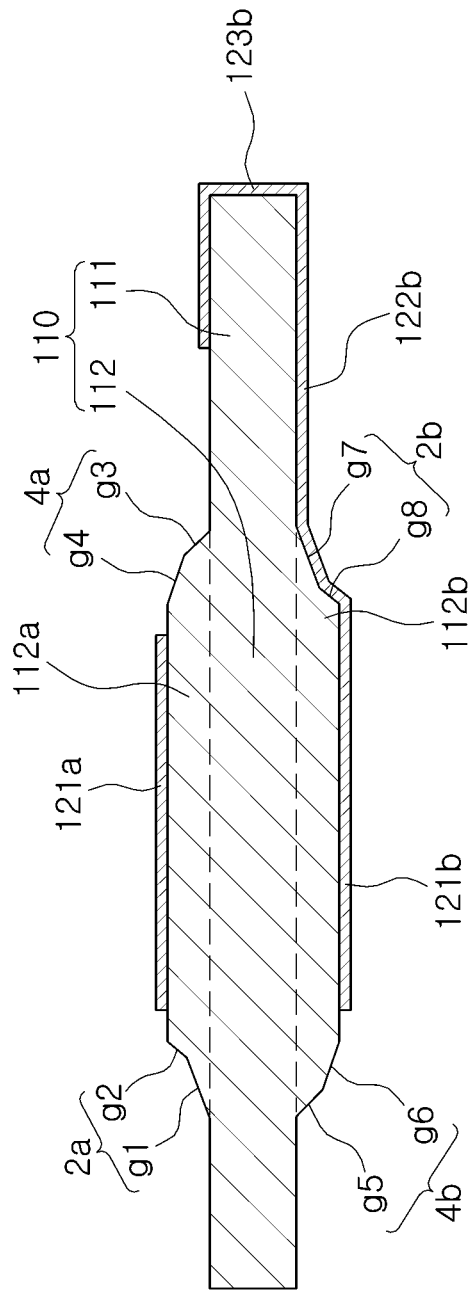
FIG. 7 is a cross-sectional view taken along line Q-Q' of FIG. 5.

For example, as shown in FIGS. 6 and 7, the first connection electrode 122a may be disposed on the fourth side surface 4a of the first protrusion portion 112a, and the second connection electrode 122b may be disposed on the second side surface 2a of the second protrusion portion 112b.

As shown in FIG. 7, even if the connection electrode is disposed on the concave side surface of the protrusion portion, according to an exemplary embodiment, a concave degree of the side surface of the protrusion portion may be alleviated, and thus occurrence of an open defect in the electrode may be decreased.

Figure 8:
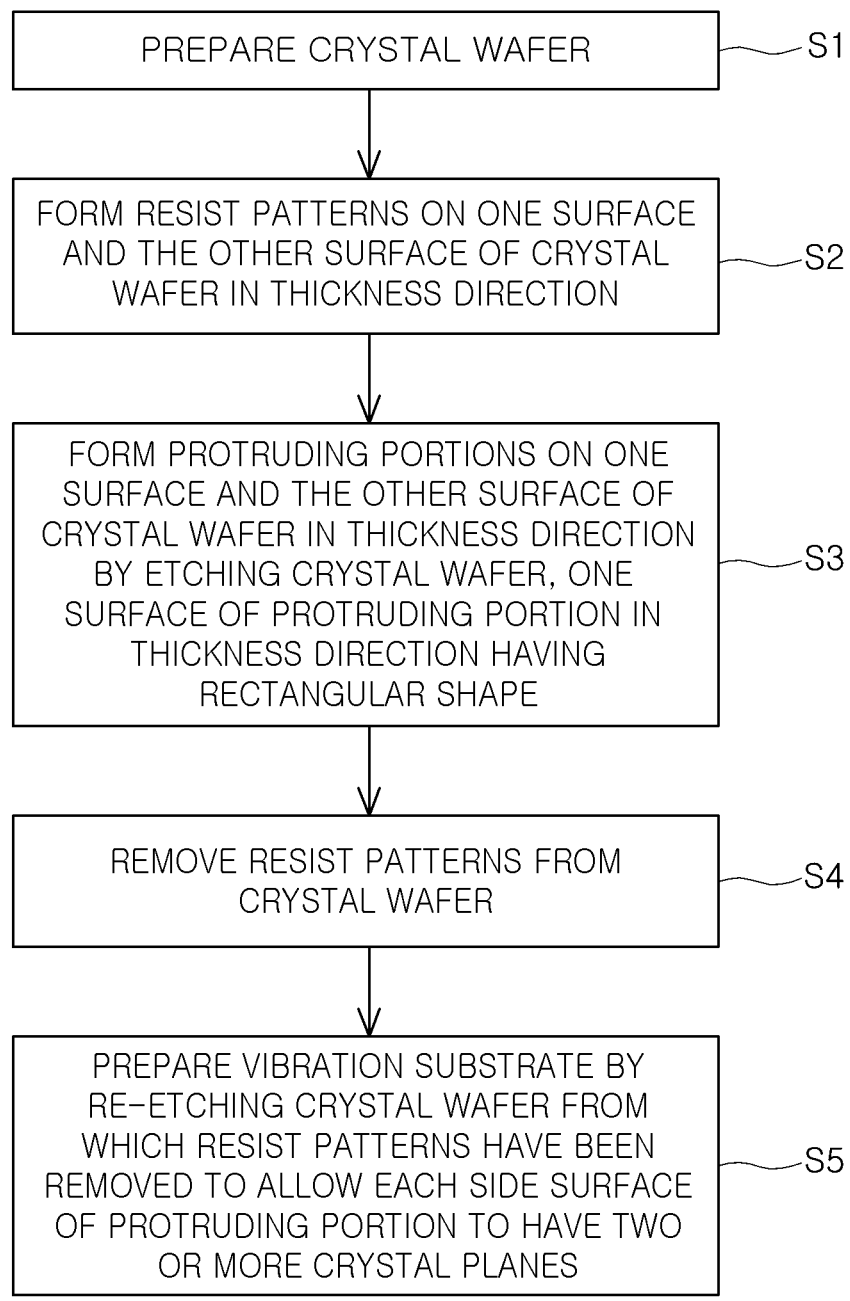
FIG. 8 is a flowchart illustrating a method of manufacturing a piezoelectric vibration member according to another exemplary embodiment in the present disclosure.

FIG. 8 is a flowchart illustrating a method of manufacturing a piezoelectric vibration member according to another exemplary embodiment; and FIGS. 9A through 12B are cross-sectional views illustrating sequential operations in the method of manufacturing a piezoelectric vibration member.

FIGS. 9A, 10A, 11A, and 12A are cross-sectional views of the piezoelectric vibration member taken along line A-A' of FIG. 1, and FIGS. 9B, 10B, 11B, and 12B are cross-sectional views of the piezoelectric vibration member taken along line B-B' of FIG. 1.

FIGS. 9A and 9B, FIGS. 10A and 10B, FIGS. 11A and 11B, and FIGS. 12A and 12B show different regions in the same operation, respectively.

Referring to FIG. 8, the method of manufacturing a piezoelectric vibration member according to the present exemplary embodiment may include preparing a crystal wafer (S1), forming resist patterns on upper and lower surfaces of the crystal wafer (S2), forming protrusion portions on the crystal wafer (S3), removing the resist patterns (S4), and re-etching the crystal wafer (S5).

In the preparing of the crystal wafer (S1), a single crystal wafer corresponding to a size of one vibration substrate may be used, and, although not shown, a crystal wafer assembly in which a plurality of crystal wafers corresponding to a size of one vibration substrate are formed may be used.

The crystal wafer may be formed by processing rough quartz in a rectangular or circular shape and then cutting the rough quartz at a predetermined thickness. However, the crystal wafer is not limited to having the rectangular or circular shape, and may have various shapes such as a polygonal shape. A surface polishing process may be additionally performed on the crystal wafer processed in the rectangular or circular shape in order to decrease a thickness of the crystal wafer.

Although a plurality of piezoelectric vibration members may be formed using the crystal wafer, a case in which a single piezoelectric vibration member is formed will be described by way of example below in order to facilitate the understanding of the exemplary embodiment.

Figure 9A:
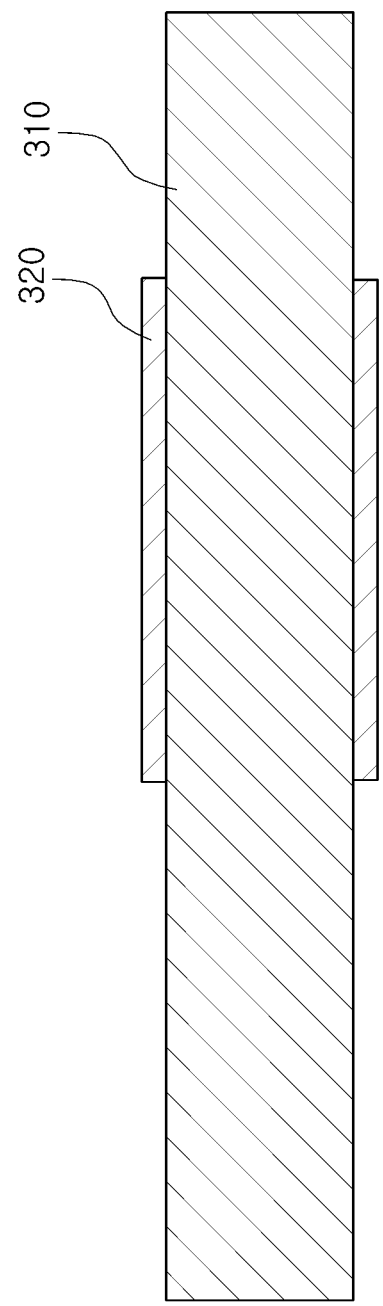
FIGS. 9A through 12B are cross-sectional views illustrating sequential operations in a method of manufacturing a piezoelectric vibration member.
Figure 9B:
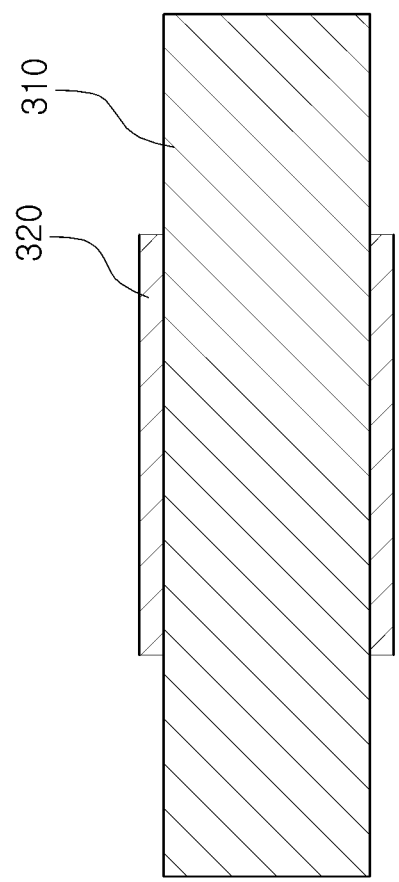

As shown in FIGS. 9A and 9B, the resist patterns 320 for forming the protrusion portions may be formed on one surface and the other surface of the crystal wafer 310 in the thickness direction (S2). The resist patterns 320 may be disposed on the crystal wafer depending on shapes and sizes of the protrusion portions.

Figure 10A:
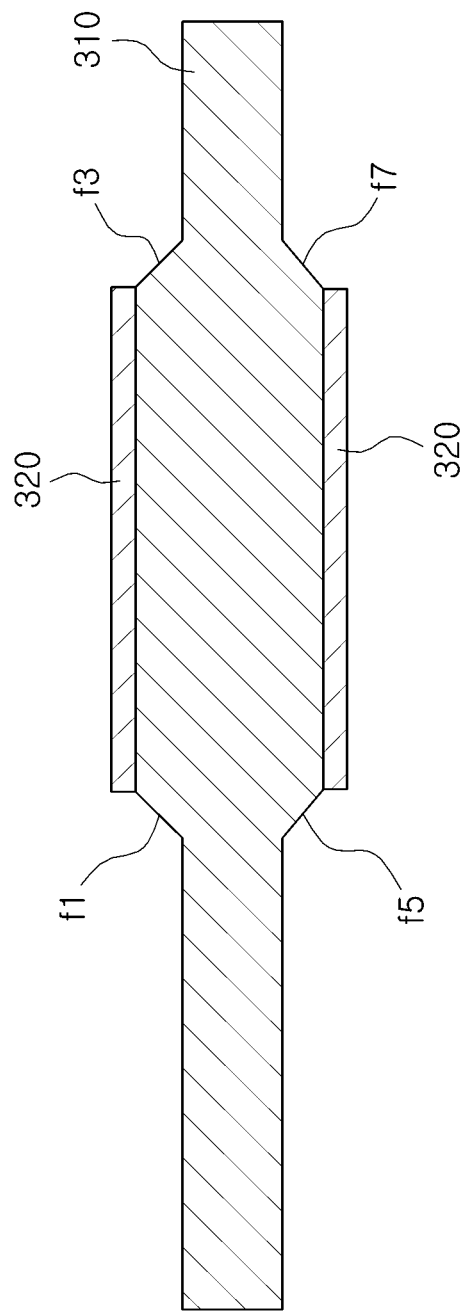
Figure 10B:
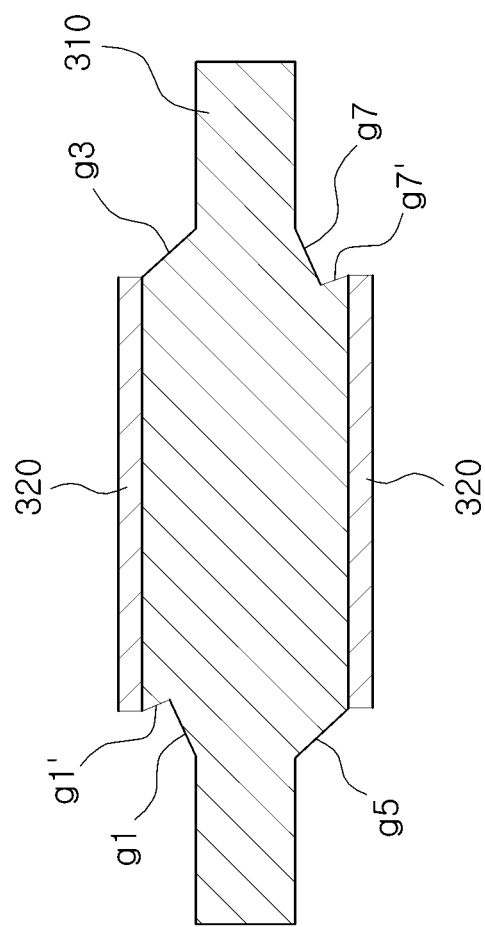

Next, as shown in FIGS. 10A and 10B, the crystal wafer 310 having the resist patterns 320 disposed thereon may be etched to form the protrusion portions on one surface and the other surface of the crystal wafer in the thickness direction, one surfaces of the protrusion portions in the thickness direction having four or more sides.

The crystal wafer 310 may be etched by a chemical etching method of immersing the crystal wafer 310 having the resist patterns 320 formed thereon in an etchant.

One or more side surfaces of the protrusion portions may have one natural crystal plane due to the present etching process.

For example, each of the side surfaces of the protrusion portions shown in the cross-sectional view of FIG. 10A taken along line A-A' of FIG. 1 may include one natural crystal plane f1, f3, f5, or f7.

For example, each side surface of upper and lower protrusion portions shown in the cross-sectional view of FIG. 10B taken along line B-B' of FIG. 1 may include a side surface including one natural crystal plane g3 or g5 and a side surface including two crystal planes g1 and g1' or g7 and g7' due to an angle of the crystal plane.

Generally, in a case of forming the crystal wafer by chemical etching, the etching operation in a state in which the resist patterns are disposed may be performed to form the protrusion portions. In this case, a step between the vibrating portion and the surrounding portion may be rapid rather than gentle.

In a case in which the step between the vibrating portion and the surrounding portion is not gentle, energy trapping efficiency may be low, and the possibility of an open defect may be increased.

Figure 11A:
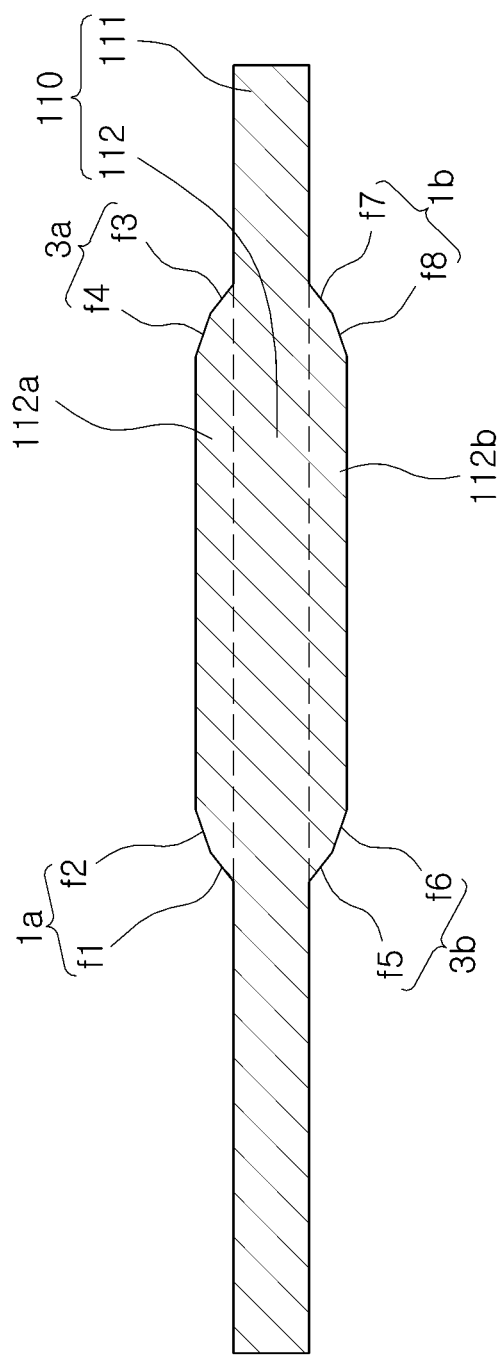
Figure 11B:
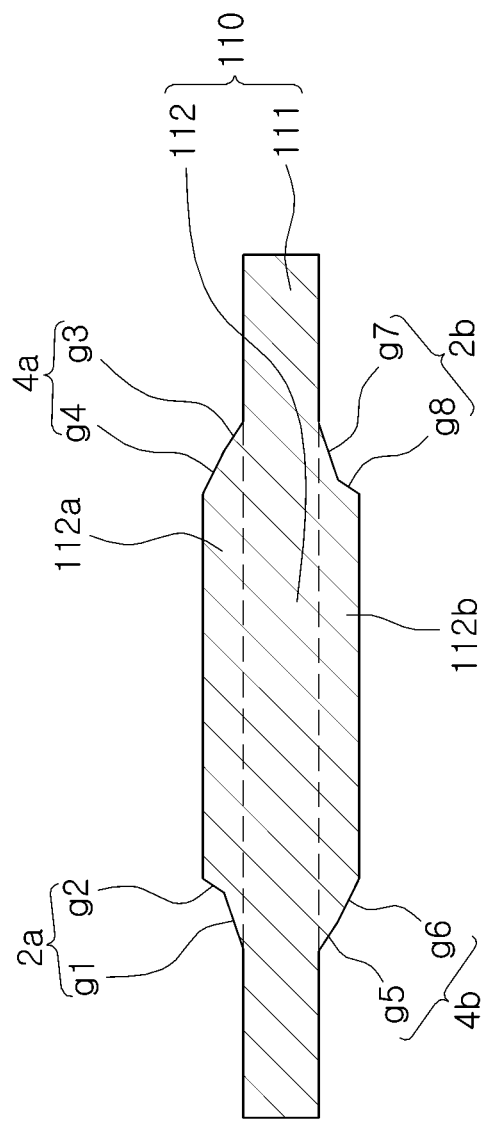

However, according to an exemplary embodiment, as shown in FIGS. 11A and 11b, the resist patterns on the etched crystal wafer 310 may be removed (S4), and the crystal wafer 310 on which separate resist patterns are not formed may be re-etched to form the vibration substrate (S5). Therefore, one or more side surfaces of the protrusion portions 112a and 112b may have two or more crystal planes to alleviate the step between the vibrating portion 112 and the surrounding portion 111. Meanwhile, according to an exemplary embodiment, each side surface of the protrusion portions 112a and 112b may have two or more crystal planes.

The crystal wafer may be re-etched by a method of immersing the crystal wafer in an etchant.

Figure 12A:
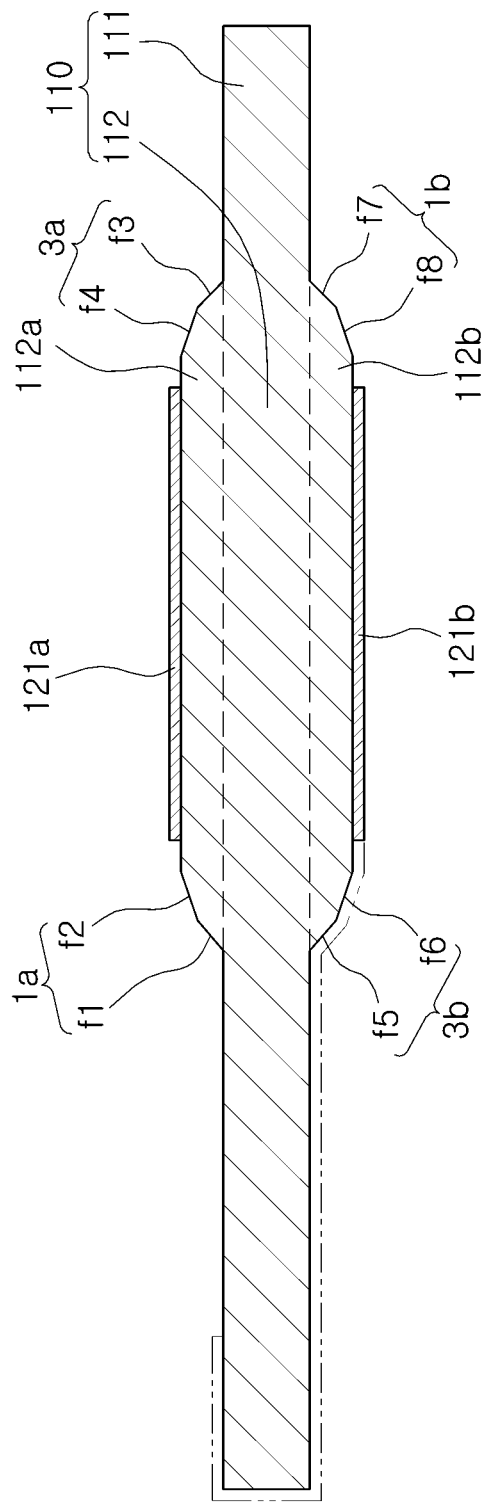
Figure 12B:
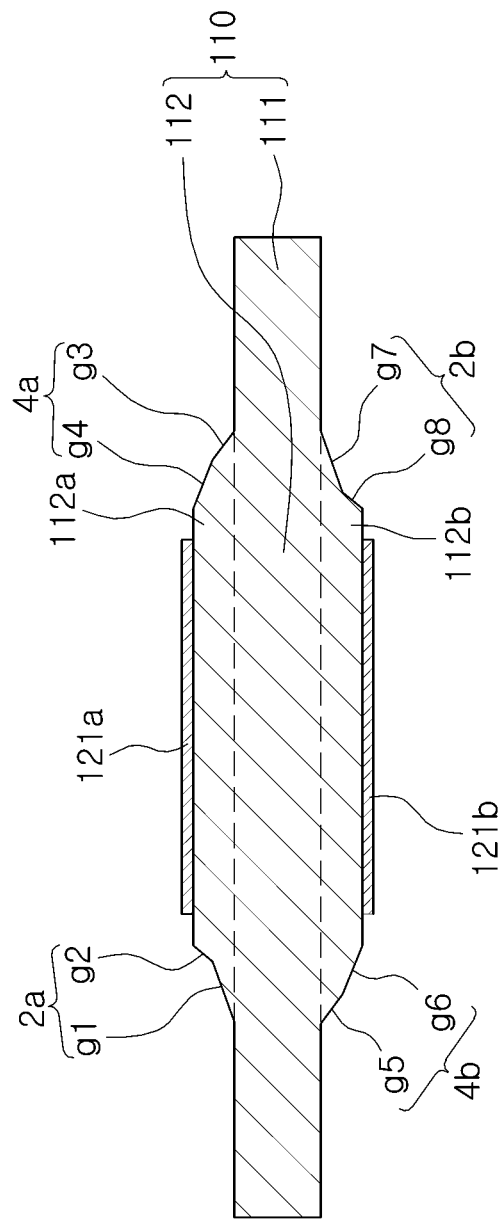

According to an exemplary embodiment, the method of manufacturing a piezoelectric vibration member may further include forming the electrode part on the vibration substrate 110 formed by re-etching the crystal wafer, as shown in FIGS. 12A and 12B.

The electrode part may include the vibrating electrodes, the terminal electrodes, and the connection electrodes, and may be formed by printing conductive pastes on the vibration substrate having the protrusion portions formed thereon.

The electrode part may have the vibrating electrodes 121a and 121b formed on one surfaces of the protrusion portions in the thickness direction.

Since a detailed description for shapes of side surfaces of the protrusion portions and the electrode part overlaps the above description for the piezoelectric vibration member 100, it will be omitted below.

Piezoelectric Vibrator

Next, a piezoelectric vibrator according to another exemplary embodiment will be described.

Figure 13:
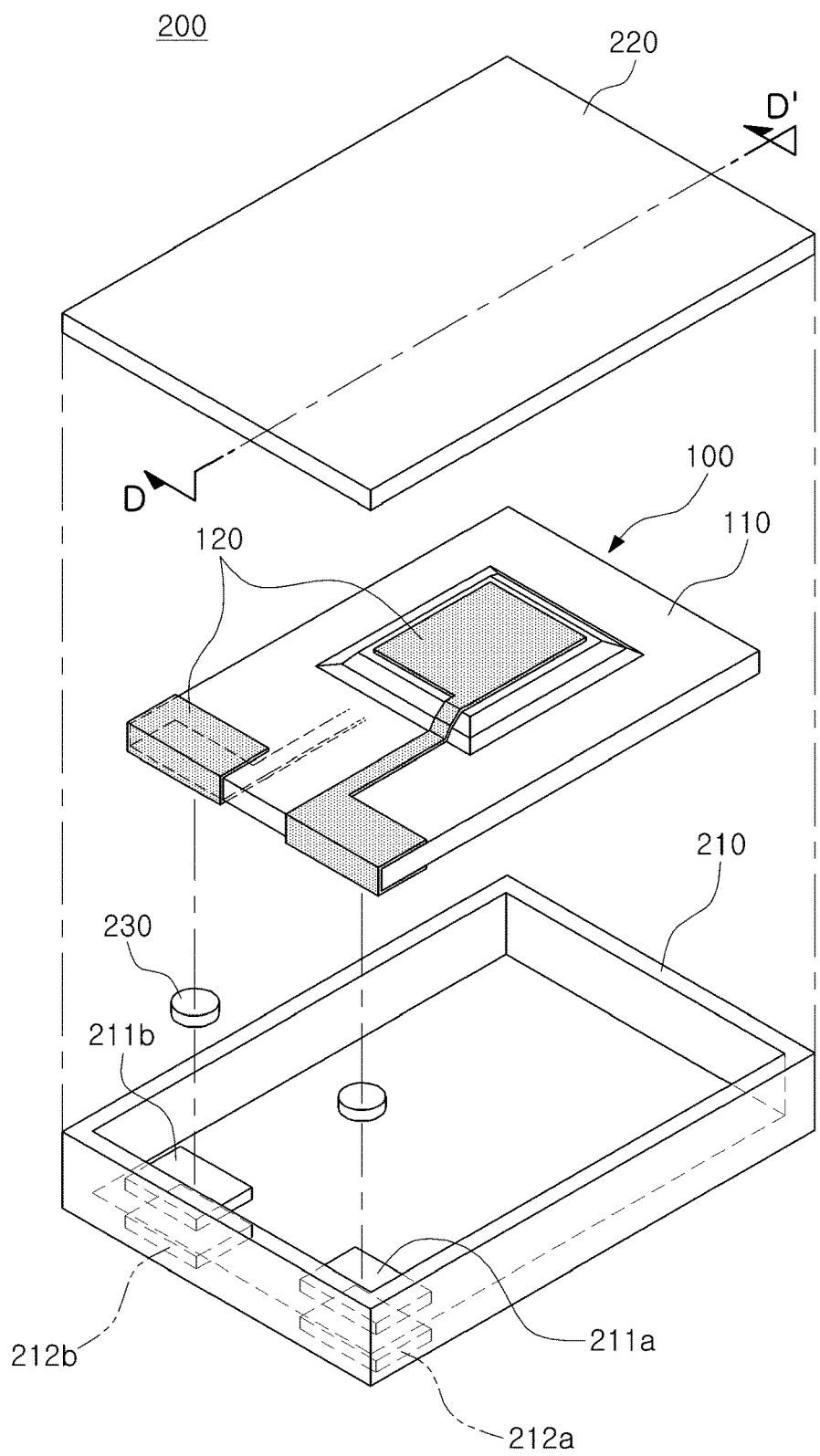
FIG. 13 is an exploded perspective view of a piezoelectric vibrator according to an exemplary embodiment in the present disclosure.
Figure 14:
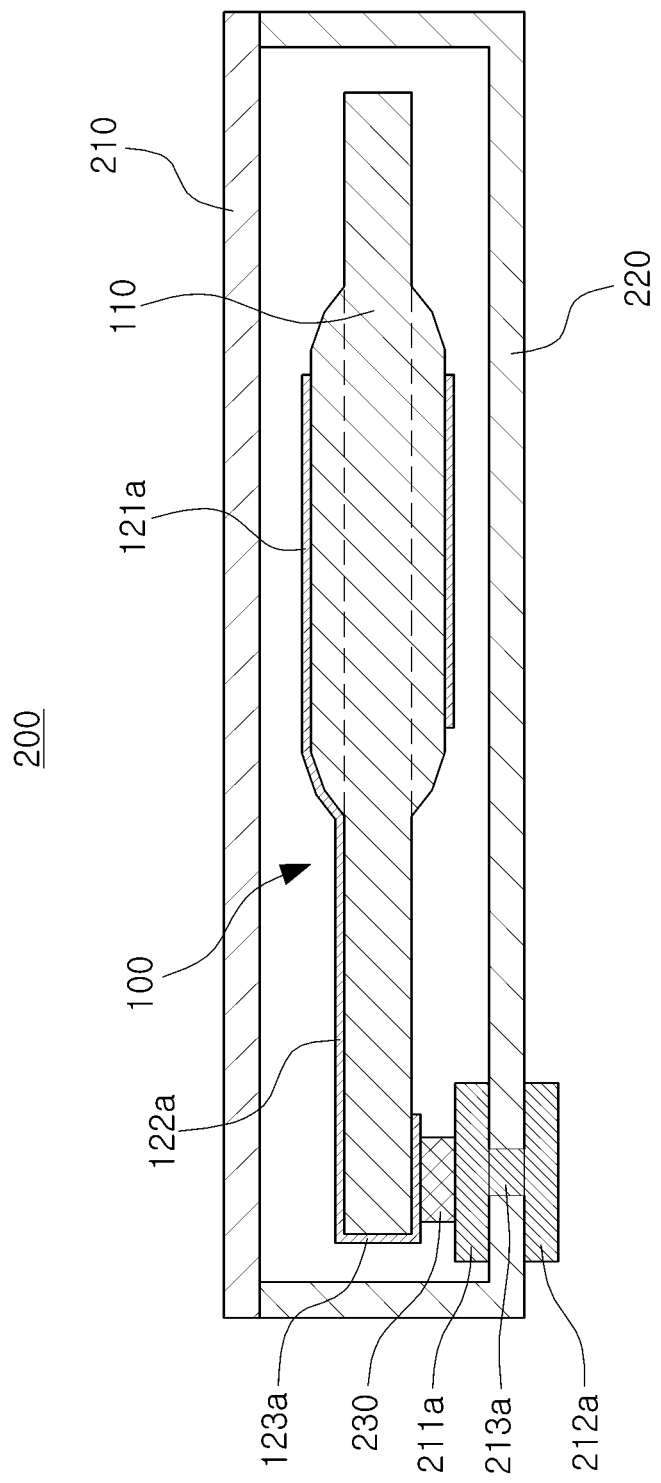
FIG. 14 is a cross-sectional view of the piezoelectric vibrator taken along line D-D' of FIG. 13.

FIG. 13 is an exploded perspective view of a piezoelectric vibrator 200 according to an exemplary embodiment; and FIG. 14 is a cross-sectional view of the piezoelectric vibrator 200 taken along line D-D' of FIG. 13.

Referring to FIGS. 13 and 14, the piezoelectric vibrator 200 according to an exemplary embodiment may include a piezoelectric vibration member 100 including a vibration substrate 110 and an electrode part 120, a lower case 210, an upper case 220, connection electrodes 211a and 211b, and external electrodes 212a and 212b.

The piezoelectric vibration member 100 included in the piezoelectric vibrator 200 according to an exemplary embodiment maybe one of the piezoelectric vibration members 100 described above. Therefore, a description of the piezoelectric vibration member 100 will be replaced by the description provided with reference to FIGS. 1 through 3, and a detailed description for the piezoelectric vibration member 100 will be omitted in order to avoid redundancy.

The lower case 210 and the upper case 220 may be coupled to each other to form a single case having an internal space formed therein, and the piezoelectric vibration member 100 may be disposed in the internal space formed by coupling the upper case and the lower case to each other.

The piezoelectric vibration member 100 may be disposed in the lower case 210 and the upper case 220 to thereby be protected from external stimuli.

The connection electrodes may include first and second connection electrodes 211a and 211b disposed to be spaced apart from each other, and the external electrodes may include first and second external electrodes 212a and 212b disposed to be spaced apart from each other.

The first and second connection electrodes 211a and 211b may be disposed on an upper surface of an inner portion of the lower case 210 and be connected to the first and second terminal electrodes 123a and 123b of the piezoelectric vibration member 100, respectively.

The first and second external electrodes 212a and 212b may be disposed on a lower surface of an outer portion of the lower case 210 and be connected to the first and second connection electrodes 211a and 211b, respectively. The first and second external electrodes 212a and 212b and the first and second connection electrodes 211a and 211b may be connected to each other by via electrodes 213a penetrating through the lower case 210, but are not limited thereto.

The first and second external electrodes 212a and 212b may serve as input and output electrodes of the piezoelectric vibrator 200. As described above, when voltage is applied to the first and second external electrodes 212a and 212b, the voltage may be applied to the first and second vibrating electrodes 121a and 121b of the piezoelectric vibration member 100, and thus the piezoelectric vibration member 100 may vibrate.

The first and second terminal electrodes 123a and 123b of the piezoelectric vibration member 100 and the first and second connection electrodes 211a and 211b may be connected to each other by a solder or a conductive adhesive. The solder or the conductive adhesive may become connection parts 230 disposed between the first and second terminal electrodes 123*a* and 123*b* of the piezoelectric vibration member 100 and the first and second connection electrodes 211*a* and 211*b* to electrically connect the first and second terminal electrodes 123*a* and 123*b* and the first and second connection electrodes 211*a* and 211*b* to each other.

The connection part 230 may further include a metal solder. The first and second connection electrodes 211*a* and 211*b* and the first and second terminal electrodes 123*a* and 123*b* of the piezoelectric vibration member 100 may be connected to each other by disposing the metal solders on the first and second connection electrodes 211*a* and 211*b*, disposing the first and second terminal electrodes 123*a* and 123*b* on the metal solders, and then performing a reflow process.

In addition, the connection part 230 may be formed by disposing nickel (Ni), gold (Au), Kovar, or the like, between the first and second connection electrodes 211*a* and 211*b* and the first and second terminal electrodes 123*a* and 123*b* and performing arc welding or electron beam welding on a coupling part such as nickel (Ni), gold (Au), Kovar, or the like, or melting gold (Au)-mercury (Hg) at a high temperature, but are not limited thereto.

Alternatively, the connection part 230 may include conductive adhesives that may contain any one of a resin or an organic material. In a case in which the conductive adhesive containing the resin or the organic material is used, air tightness between the piezoelectric vibration member 100 and the connection electrodes 211*a* and 211*b* may be increased, and generation of cracks may be prevented.

The upper case 220 and the lower case 210 may contain the same material, such as an insulating resin, but are not limited thereto.

As set forth above, according to exemplary embodiments, the piezoelectric vibration member, the method of manufacturing the same, and the piezoelectric vibrator having an excellent energy trapping effect and improved electrode connectivity may be provided.

While exemplary embodiments have been shown and described above, it will be apparent to those skilled in the art that modifications and variations could be made without departing from the scope of the present invention as defined by the appended claims.

What is claimed is:

1. A piezoelectric vibration member comprising:
   a vibration substrate including a vibrating portion and a surrounding portion which is thinner than the vibrating portion; and
   vibrating electrodes disposed on one surface and the other surface of the vibrating portion in a thickness direction of the vibration substrate,
   wherein the vibrating portion includes protrusion portions protruding in relation to one surface and the other surface of the surrounding portion in the thickness direction, and
   at least one side surface of the protrusion portion has two or more crystal planes, and
   wherein at least one side surface of the protrusion portion includes a crystal plane having an acute angle with respect to an extension plane of one surface of the surrounding portion in the thickness direction and a crystal plane having an obtuse angle with respect to one surface of the protrusion portion in the thickness direction.

2. A piezoelectric vibration member comprising:
   a vibration substrate including a vibrating portion and a surrounding portion which is thinner than the vibrating portion;
   vibrating electrodes disposed on one surface and the other surface of the vibrating portion in a thickness direction of the vibration substrate;
   terminal electrodes disposed on the one surface and the other surface of the surrounding portion in the thickness direction; and
   connection electrodes connecting the terminal electrodes and the vibrating electrodes to each other.

3. The piezoelectric vibration member of claim 2, wherein the connection electrodes are disposed on one or more side surfaces of the protrusion portion.

4. A piezoelectric vibration member comprising:
   a vibration substrate including a vibrating portion and a surrounding portion which is thinner than the vibrating portion; and
   vibrating electrodes disposed on one surface and the other surface of the vibrating portion in a thickness direction of the vibration substrate,
   wherein the vibrating portion includes protrusion portions protruding in relation to one surface and the other surface of the surrounding portion in the thickness direction, and
   at least one side surface of the protrusion portion has two or more crystal planes,
   wherein at least one side surface of the protrusion portion includes a natural crystal plane of a quartz crystal and a crystal plane having an angle of inclination which is different from that of the natural crystal plane.

5. A piezoelectric vibration member comprising:
   a vibration substrate including a vibrating portion and a surrounding portion which is thinner than the vibrating portion; and
   vibrating electrodes disposed on one surface and the other surface of the vibrating portion in a thickness direction of the vibration substrate,
   wherein the vibrating portion includes protrusion portions protruding in relation to one surface and the other surface of the surrounding portion in the thickness direction, and
   at least one side surface of the protrusion portion has two or more crystal planes,
   wherein when one side surface of the protrusion portion includes two crystal planes, $\theta_1 > \theta_3$ is satisfied where an angle between a crystal plane of the two crystal planes which is adjacent to the surrounding portion and an extension plane of one surface of the surrounding portion in the thickness direction is $\theta_1$ and an angle between a crystal plane adjacent to an upper surface of the protrusion portion and a plane which is parallel to one surface of the surrounding portion in the thickness direction is $\theta_3$.

6. A piezoelectric vibration member comprising:
   a vibration substrate having protrusion portions disposed on one surface and the other surface of the vibration substrate in a thickness direction thereof, one surface of the protrusion portion in the thickness direction having four or more sides; and
   vibrating electrodes disposed on the protrusion portions,
   wherein at least one side surface of the protrusion portion has two or more crystal planes having different angles of inclination.

7. A piezoelectric vibrator comprising:
a piezoelectric vibration member including a vibration substrate including a vibrating portion and a surrounding portion which is thinner than the vibrating portion, and vibrating electrodes disposed on one surface and the other surface of the vibrating portion in a thickness direction, the vibrating portion including protrusion portions protruding in relation to one surface and the other surface of the surrounding portion in the thickness direction, and at least one side surface of the protrusion portion having two or more crystal planes;
upper and lower cases accommodating the piezoelectric vibration member therein;
connection electrodes disposed on an upper surface of the lower case and electrically connected to an electrode part including the vibrating electrodes; and
external electrodes disposed on a lower surface of the lower case and electrically connected to the connection electrodes.

8. The piezoelectric vibrator of claim 7, wherein the electrode part further includes terminal electrodes which are disposed on one surface of the surrounding portion in the thickness direction and are connected to the vibrating electrodes, and
a connection part is disposed between the terminal electrodes and the connection electrodes to form electrical connections there between.

* * * * *